(12) United States Patent
Song

(10) Patent No.: US 8,193,829 B2
(45) Date of Patent: Jun. 5, 2012

(54) SEMICONDUCTOR DEVICE, MEMORY SYSTEM, AND METHOD FOR CONTROLLING TERMINATION OF THE SAME

(75) Inventor: Choung-Ki Song, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 12/833,624

(22) Filed: Jul. 9, 2010

(65) Prior Publication Data

US 2011/0267098 A1   Nov. 3, 2011

(30) Foreign Application Priority Data

Apr. 29, 2010   (KR) .................. 10-2010-0039942

(51) Int. Cl.
*H03K 17/16* (2006.01)
*H03K 19/003* (2006.01)
(52) U.S. Cl. ............... 326/30; 365/194; 365/230.06
(58) Field of Classification Search .............. 326/30; 365/191, 194, 230.06
See application file for complete search history.

(56) References Cited

U.S. PATENT DOCUMENTS

| 7,148,721 | B2* | 12/2006 | Park ................... 326/30 |
| 7,449,914 | B2* | 11/2008 | Kim et al. ............. 326/30 |
| 7,532,523 | B2* | 5/2009 | Braun et al. ........... 365/194 |
| 7,865,661 | B2* | 1/2011 | Butt et al. ............ 711/105 |
| 2004/0240298 | A1* | 12/2004 | Jin .................. 365/222 |
| 2006/0002201 | A1* | 1/2006 | Janzen ................ 365/191 |
| 2010/0001758 | A1* | 1/2010 | Dreps et al. ........... 326/30 |
| 2011/0002180 | A1* | 1/2011 | Song et al. ........... 365/193 |

FOREIGN PATENT DOCUMENTS

KR   1020050081607   8/2005
KR   1020050095387   9/2005

OTHER PUBLICATIONS

Notice of Allowance issued from Korean Intellectual Property Office on Jul. 28, 2011.

* cited by examiner

*Primary Examiner* — Jason M Crawford
(74) *Attorney, Agent, or Firm* — IP & T Group LLP

(57) ABSTRACT

A semiconductor device includes a plurality of first input units configured to receive a command, a second input unit configured to receive a termination command, a termination control unit configured to be enabled by the termination command and decode the command to control a termination operation, and a termination unit configured to be controlled by the termination control unit and terminate an interface pad.

10 Claims, 8 Drawing Sheets

FIG. 4
(PRIOR ART)

| Function | CKE | | CSB | RASB | CASB | WEB | |
|---|---|---|---|---|---|---|---|
| MRS | H | H | L | L | L | L | |
| REF | H | H | L | L | L | H | |
| SRE | H | L | L | L | L | H | |
| SRX | L | H | H | X | X | X | |
| | | | L | H | H | H | |
| PRE | H | H | L | L | H | L | A10=Low |
| PREA | H | H | L | L | H | H | A10=High |
| ACT | H | H | L | L | H | H | |
| WR | H | H | L | H | L | L | A10=Low |
| WRA | H | H | L | H | L | L | A10=High |
| RD | H | H | L | H | L | H | A10=Low |
| RDA | H | H | L | H | L | H | A10=High |
| NDP | H | H | L | H | H | H | |
| DES | H | H | H | X | X | X | |
| PDE | H | L | L | H | H | H | |
| | | | H | X | X | X | |
| PDX | L | H | L | H | H | H | |
| | | | H | X | X | X | |
| ZQCL | H | H | L | H | H | L | A10=High |
| ZQCS | H | H | L | H | H | L | A10=Low |

FIG. 8

| Function | CKE | | CSTB | CSB | RASB | CASB | WEB | |
|---|---|---|---|---|---|---|---|---|
| MRS | H | H | X | L | L | L | L | |
| REF | H | H | X | L | L | L | H | |
| SRE | H | L | X | L | L | L | H | |
| SRX | L | H | X | H | X | X | X | |
| | | | X | L | H | H | H | |
| PRE | H | H | X | L | L | H | L | A10=Low |
| PREA | H | H | X | L | L | H | H | A10=High |
| ACT | H | H | X | L | L | H | H | |
| WR | H | H | X | L | H | L | L | A10=Low |
| WRA | H | H | X | L | H | L | L | A10=High |
| RD | H | H | X | L | H | L | H | A10=Low |
| RDA | H | H | X | L | H | L | H | A10=High |
| NDP | H | H | X | L | H | H | H | |
| DES | H | H | X | H | X | X | X | |
| PDE | H | L | X | L | H | H | H | |
| | | | X | H | X | X | X | |
| PDX | L | H | X | L | H | H | H | |
| | | | X | H | X | X | X | |
| ZQCL | H | H | X | L | H | H | L | A10=High |
| ZQCS | H | H | X | L | H | H | L | A10=Low |
| WRODT | H | H | L | X | H | L | L | |
| RDODT | H | H | L | X | H | L | H | |
| OFFODT | H | H | L | X | L | H | H | |
| ONODT | H | H | L | X | L | H | L | |

SEMICONDUCTOR DEVICE, MEMORY SYSTEM, AND METHOD FOR CONTROLLING TERMINATION OF THE SAME

CROSS-REFERENCE TO RELATED APPLICATIONS

The present application claims priority of Korean Patent Application No. 10-2010-0039942, filed on Apr. 29, 2010, which is incorporated herein by reference in its entirety.

BACKGROUND OF THE INVENTION

Exemplary embodiments of the present invention relate to a semiconductor device, a memory system, and a method for controlling a termination operation of the same.

A memory device includes termination circuits configured to terminate interface pads inside the memory device, in order to perform a high-speed operation. It means, for example, that the termination circuits adjust impedance/resistant of the interface pad for an impedance matching at an interface stage. The interface pads may include a data (DQ) pad and a data strobe signal (DQS) pad. The termination circuit is controlled to be turned-on/off or to change a termination resistance value through an on-die termination (ODT) pin, thereby minimizing a jitter effect occurring in the interface stage.

FIG. 1 is a configuration diagram of a conventional memory system.

Referring to FIG. 1, the memory system includes a memory controller 110 and a memory device 120.

The memory controller 110 applies a command CSB, RASB, CASB, and WEB for controlling the memory device 120 and an on-die termination (ODT) signal ODT for controlling the turn-on/off of a termination circuit of the memory device 120.

The memory device 120 decodes the applied command CSB, RASB, CASB, and WEB and performs a variety of operations such as read and write operations. When the ODT signal ODT is activated, the memory device 120 enables the termination circuit inside the memory device 120 in response to the ODT signal ODT. When the ODT signal ODT is deactivated, the memory device 120 disables the termination circuit inside the memory device 120 in response to the ODT signal ODT.

Between the memory controller 110 and the memory device 120, a data channel, an address channel and so on may be formed in addition to the command channels and the ODT signal channel. FIG. 1 omits the data channel and the address channel for the convenience of the description.

FIG. 2 is a timing diagram showing that the termination circuit is controlled to be turned on/off through the ODT pin during the read operation of the memory device.

Referring to FIG. 2, during the initial period in which the ODT signal ODT is activated to high level, the termination circuit terminates an interface pad with a default termination resistance value Rtt_default. That is, the termination circuit controls a termination resistance value with the default termination resistance value Rtt_default. In FIG. 2, a signal Rterm represents the operation of the termination circuit.

Then, a read command RD is applied. After a time corresponding to CAS latency (CL) elapses from the application time of the read command RD, a data strobe signal DQS is toggled, and data DQ is inputted. While the data DQ is inputted, the termination circuit is to be turned off.

Therefore, after a certain time (e.g., two clocks) elapses after the application of the read command RD, the ODT signal ODT is deactivated to low level, and the termination circuit is turned off in response to the ODT signal ODT. When the ODT signal ODT is activated to high level, the termination circuit is turned on in response to the ODT signal ODT. A time difference between the activation/deactivation of the ODT signal and the turn on/off of the termination circuit is defined by JEDEC SPEC. In the case of the DDR3 memory device, such a time difference is defined as clocks smaller than the clocks corresponding to CAS write latency (CWL) by 2 clocks.

As described above with reference to FIG. 2, the turn on/off of the termination circuit in the memory device is controlled by the activation/deactivation of the ODT signal.

FIG. 3 is a timing diagram showing a dynamic ODT operation of the memory device.

The dynamic ODT operation refers to an operation which automatically changes the termination resistance value of the termination circuit during a period in which data DQ is inputted in response to an applied write command WR without resetting the termination resistance value by a mode resister set (MRS) or the like.

Referring to FIG. 3, the ODT signal ODT continuously maintains the activation to high level. Therefore, the termination circuit maintains the turn-on state. During the initial period of FIG. 3, the termination resistance value is maintained to a default termination resistance value (Rterm=Rtt_default). However, when the write command WR is applied, the data strobe signal DQS is toggled in response to the write command WR. During a period in which the data DQ is inputted, the termination resistance value is changed into a termination resistance value Dynamic ODT by the dynamic ODT operation. That is, the termination circuit maintains the default termination resistance value Rtt_default of 30 or 40Ω during the initial period, and the default termination resistance value Rtt_default is changed into the termination resistance value Dynamic ODT of 60 or 120Ω during the period in which the data DQ is inputted in response to the write command WR.

As described above with reference to FIG. 3, the change of the termination resistance value among the operations of the memory device may be controlled by the write command WR.

FIG. 4 is a command decoding truth table of the DDR3 memory device defined in JEDEC.

FIG. 4 shows combinations of command signals and decoding results based on the combinations. For example, a combination of CSB=L, RASB=H, CASB=L, and WEB=L is applied to the memory device, the memory device decodes the combination and recognizes the decoded combination as a write command WR.

The functions defined in FIG. 4 may be represented as follows.

MRS represents Mode Register Set, REF represents Refresh, SRE represents Self Refresh Entry, SRX represents Self Refresh Exit, PRE represents Single-bank Precharge, PREA represents Precharge all bank, ACT represents Bank Active, WR represents Write, WRA represents Write with auto precharge, RD represents Read, RDA represents Read with auto precharge, NOP represents No Operation, DES represents Device Deselected, PDE represents Power-Down Entry, PDX represents Power-Down Exit, ZQCL represents ZQ Calibration long, and ZQCS represents ZQ Calibration Short.

The functions and signals of the truth table of FIG. 4 are apparent to those skilled in the art to which the present invention pertains. Therefore, the description thereof is omitted.

FIG. 5 is an internal configuration diagram of the conventional memory device.

In FIG. 5, blocks CSB, CASB, RASB, and WEB represent buffers configured to receive the respective command signals, a block CK represents a buffer configured to receive a clock signal, a block ADDR represents a buffer configured to receive an address, and a block ODT represents a buffer configured to receive an ODT signal. A block DQS represents a buffer configured to receive a data strobe signal, and a block DQ represents a circuit block configured to receive and output data. The blocks DQ and DQS may include termination circuits, because the blocks DQ and DQS have channels with external memory controllers. Blocks LAT represent latch circuits configured to latch the signals inputted to the buffers, and a block DLL represents a delay-locked loop circuit. A block CMD DEC & CTRL represents a control circuit configured to decode a command to control the operation of the memory device, and a block ODT CTRL represents a control circuit configured to control the turn on/off of the termination circuit by using the ODT signal. A block S2P/P2S represents a circuit configured to parallel-to-serial convert or serial-to-parallel convert the data inputted/outputted through the circuit block DQ. A block GIO Driver represents a circuit configured to transfer data between the block S2P/P2S and a block Column, the block Column represents a circuit for a column operation of a block CORE, and a block ROW represents a circuit for a row operation of the block CORE. The block CORE represents a core area of the memory device in which the data is stored.

Referring to FIG. 5, the termination operation of the conventional memory device is described. The ODT signal inputted through the buffer ODT is latched by the latch circuit LAT and transferred to the block ODT CTRL. When the ODT signal is activated, the block ODT CTRL turns on the termination circuits of the blocks DQS and DQ in response to the ODT signal. When the ODT signal is deactivated, the block ODT CTRL turns off the termination circuits of the blocks DQS and DQ in response to the ODT signal. As such, the turn-on/off of the termination circuits are controlled by the block ODT CTRL which operates by receiving the ODT signal inputted through the buffer.

The command signals inputted through the respective buffer CSB, CASB, RASB, and WEB are latched by the respective latch circuits LAT and transferred to the block CMD DEC & CTRL. The block CMD DEC & CTRL decodes the command signals. Depending on the decoding result, when it is determined that the write command WR is applied, the block CMD DEC & CTRL changes the termination resistance values of the termination circuits inside the blocks DQS and DQ. As such, the change of the termination resistance values of the termination circuits is controlled by the block CMD DEC & CTRL which operates by receiving the command signals.

As described with reference to FIGS. 2, 3, and 5, the control of the turn on/off of the termination circuits and the change of the termination resistance values of the termination circuits in the conventional memory system are performed in different manners from each other. That is, the control of the termination circuit by the ODT signal inputted through the ODT pin and the control of the termination resistance values by the command signals are used together. This may cause the complexity of the data with which the memory controller controls the memory device. Furthermore, the design of the memory device may become complex.

SUMMARY OF THE INVENTION

An exemplary embodiment of the present invention is directed to technology which reduces a burden of a memory controller and simplifies the design of a memory device by combining/unifying control methods of termination circuits.

In accordance with an exemplary embodiment of the present invention, a semiconductor device includes a plurality of first input units configured to receive a command, a second input unit configured to receive a termination command, a termination control unit configured to be enabled by the termination command and decode the command to control a termination operation, and a termination unit configured to be controlled by the termination control unit and terminate an interface pad.

In accordance with another exemplary embodiment of the present invention, a memory system includes a memory controller configured to apply a command for controlling a memory device and a termination command for a termination operation to the memory device, and the memory device configured to decode the command inputted during an activation period of the termination command and control the termination operation.

The memory device may include: a plurality of first input units configured to receive the command; a second input unit configured to receive the termination command; a termination control unit configured to be enabled by the termination command received by the second input unit, decode the command signal received by the plurality of first input units, and control a termination operation; and a termination unit configured to be controlled by the termination control unit and terminate an interface pad.

The plurality of first input units may receive at least two or more of a row address strobe signal, a column address strobe signal, a write enable signal, and a chip select signal.

The termination control unit decodes the command received by the plurality of first input units during an activation period of the termination command.

In accordance with yet another exemplary embodiment of the present invention, a method for controlling a memory device includes inputting a command for controlling the memory device, inputting a termination command for the command to be used for a termination operation, and decoding the command to control the termination operation for an interface node of the memory device in response to the termination command.

BRIEF DESCRIPTION OF THE DRAWINGS

FIG. 4 is a command decoding truth table of the DDR3 memory device defined in JEDEC.

FIG. 8 is a command decoding truth table in accordance with the embodiment of the present invention.

DESCRIPTION OF SPECIFIC EMBODIMENTS

Figure 1:
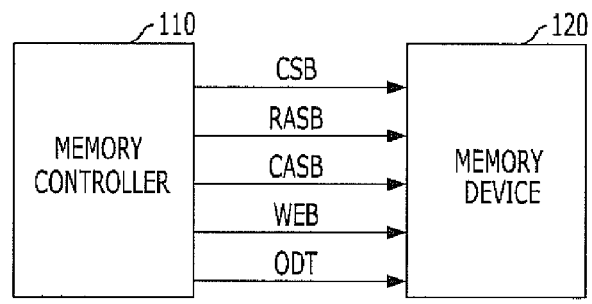
FIG. 1 is a configuration diagram of a conventional memory system.
Figure 2:
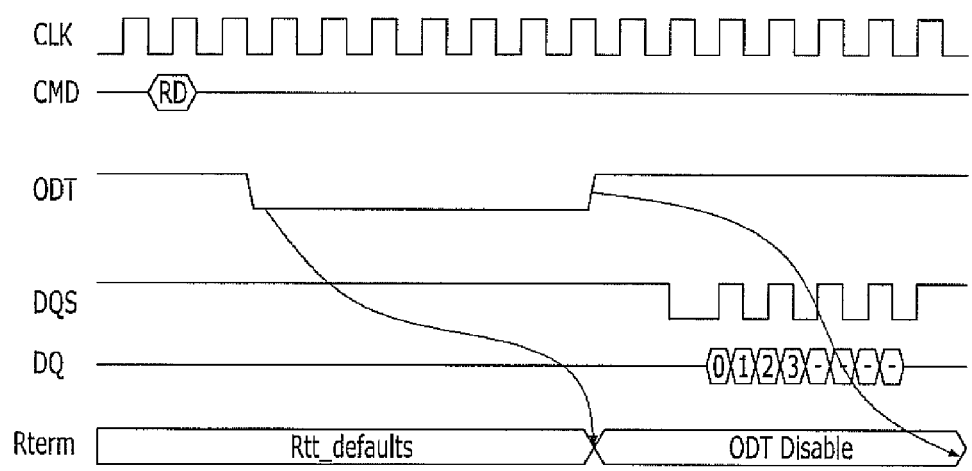
FIG. 2 is a timing diagram showing that a termination circuit is controlled to be turned on/off through an ODT pin during a read operation of a memory device.
Figure 3:
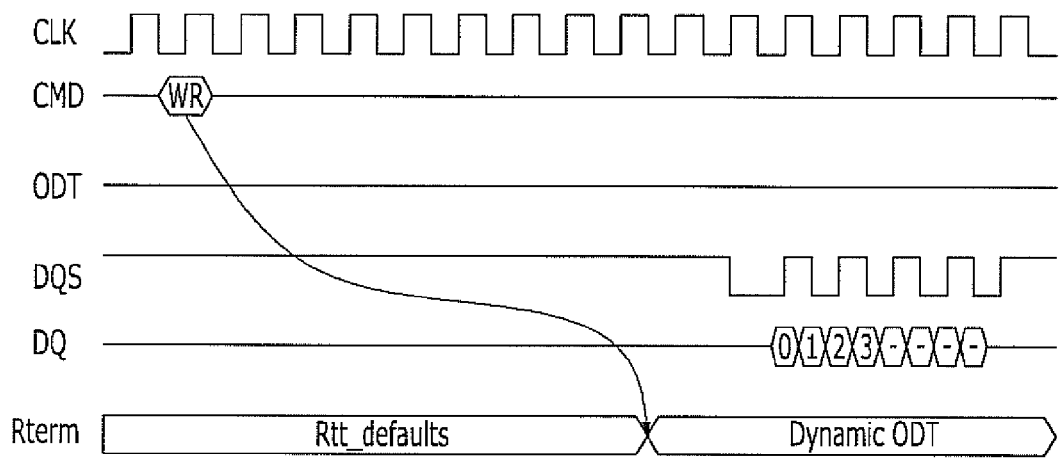
FIG. 3 is a timing diagram showing a dynamic ODT operation of the memory device.
Figure 5:
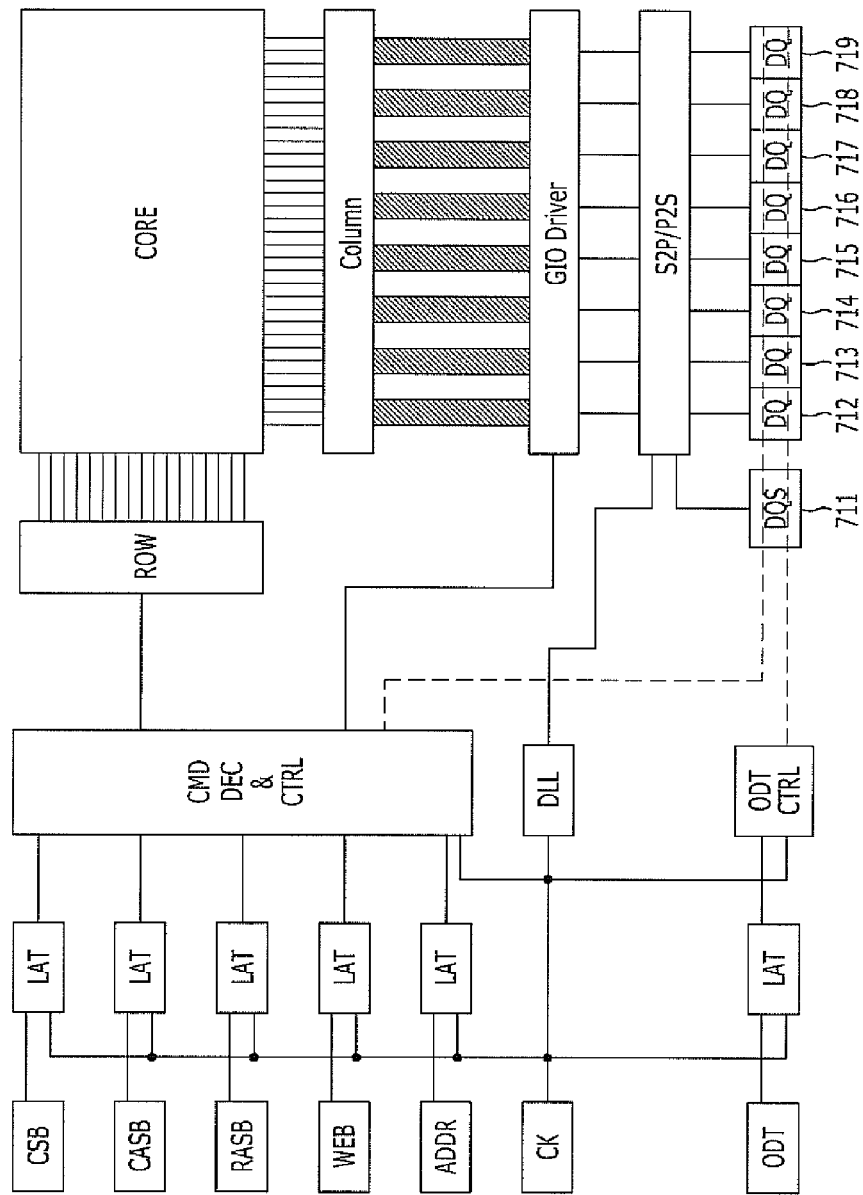
FIG. 5 is an internal configuration diagram of the conventional memory device.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 6:
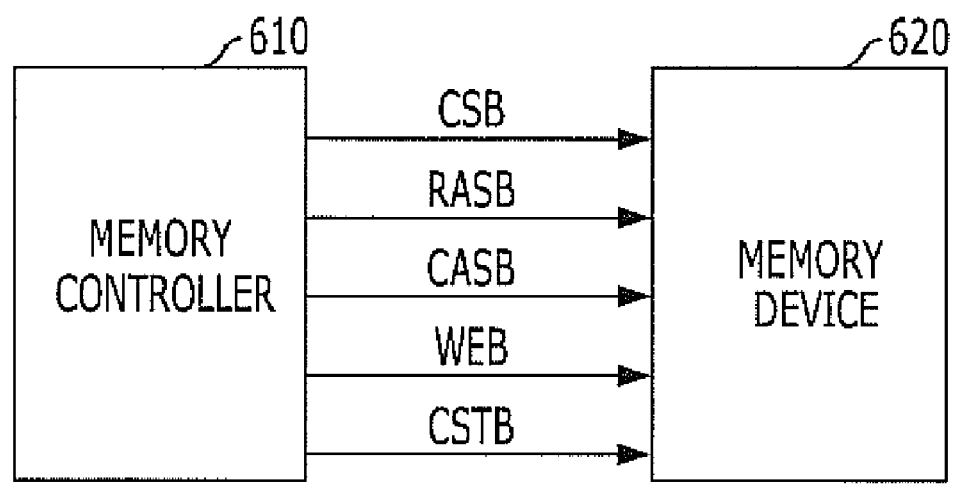
FIG. 6 is a configuration diagram of a memory system in accordance with an embodiment of the present invention.

FIG. 6 is a configuration diagram of a memory system in accordance with an embodiment of the present invention.

Referring to FIG. 6, the memory system includes a memory controller 610 and a memory device 620.

The memory controller 610 applies commands CSB, RASB, CASB, and WEB and a termination command CSTB to the memory device 620. The commands CSB, RASB, CASB, and WEB are applied to control the memory device 620, and control a termination operation of the memory device 620 depending on the termination command CSTB.

In response to an activation of the termination command CSTB, the memory device 620 decodes the commands CSB, RASB, CASB, and WEB to control its termination operation. General operations other than the termination operation of the memory device 620 can be also performed by decoding the commands CSB, RASB, CASB, and WEB. That is, during a period in which the termination command CSTB is deactivated, the memory device 620 decodes the commands CSB, RASB, CASB, and WEB to perform general operations, as in the conventional memory system. However, when the termination command CSTB is activated, the memory device 620 decodes the commands CSB, RASB, CASB, and WEB to control its termination operation. The control of the termination operation means controlling the turn-on/off and the termination resistance values of termination circuits.

The termination command CSTB in accordance with the embodiment of the present invention makes the memory device 620 recognize the inputted commands CSB, RASB, CASB, and WEB as a command for controlling the termination operation. The commands CSB, RASB, CASB, and WEB inputted at the activation of the termination command CSTB are decoded to control the termination operation. All the commands CSB, RASB, CASB, and WEB need not be decoded to control the termination operation. It is sufficient that some of the commands CSB, RASB, CASB, and WEB be decoded to control the termination operation.

Signals which are not directly related to the termination operation, among the signals transferred between the memory controller 610 and the memory device 620, are omitted in FIG. 6.

Figure 7:
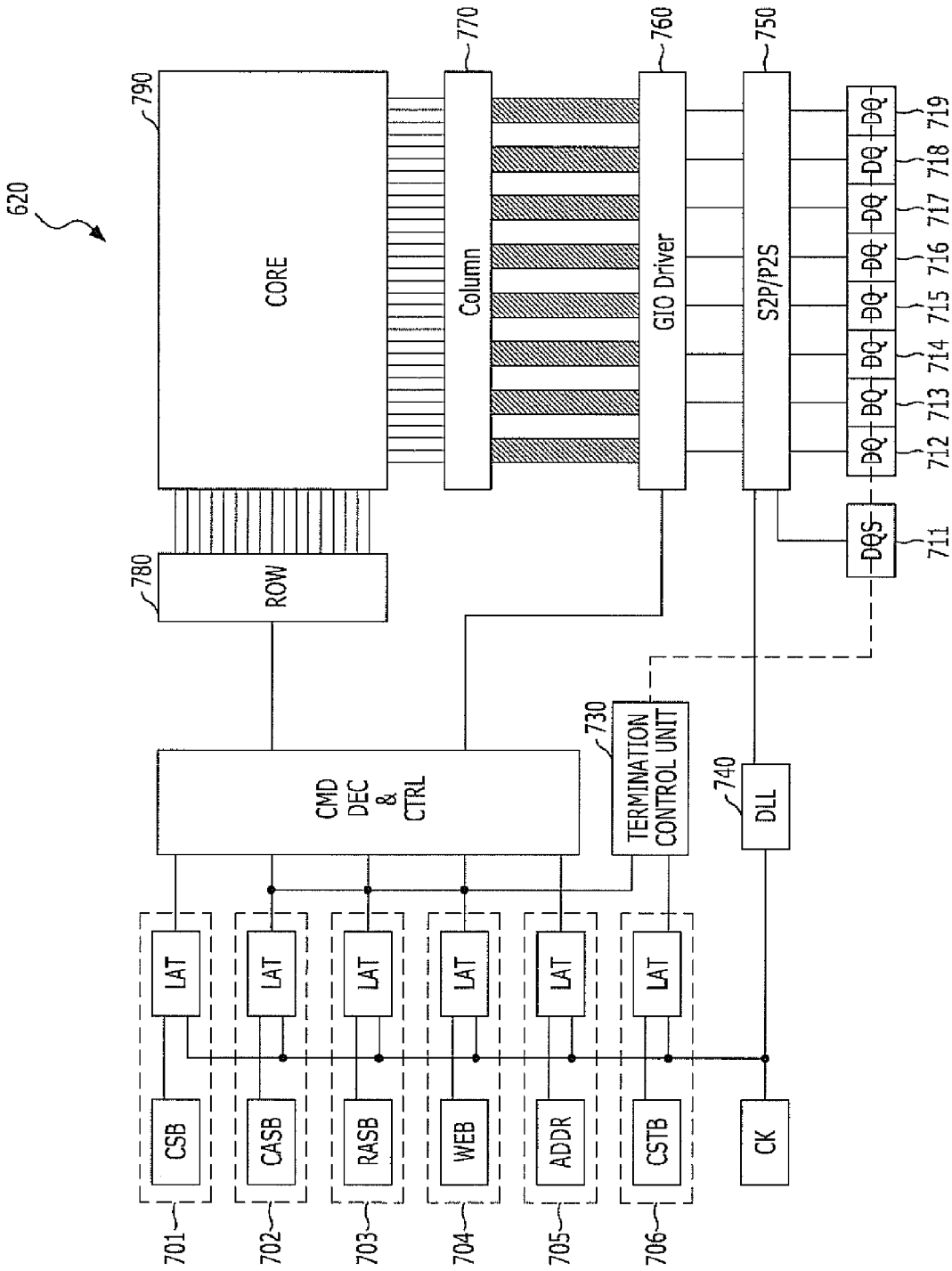
FIG. 7 is a configuration diagram of a memory device shown in FIG. 6.

FIG. 7 is a configuration diagram of the memory device 620 of FIG. 6.

Referring to FIG. 7, the memory device 620 includes a plurality of first input units 701 to 704, a second input unit 706, a termination control unit 730, and a plurality of termination units 711 to 719. The plurality of first input units 701 to 704 are configured to receive commands CSB, CASB, RASB, and WEB. The second input unit 706 is configured to receive a termination command CSTB. The termination control unit 730 is configured to be enabled by the termination command CSTB received by the second input unit 706 and decode the command CSB, CASB, RASB, and WEB received by the plurality of first input units 701 to 704 to control the termination operation. The termination units 711 to 719 are configured to be controlled by the termination control unit 730 and adjust the resistance of interface pads.

The plurality of first input units 701 to 704 include buffers configured to receive the signals composing the commands CSB, CASB, RASB, and WEB, respectively, and latch circuits configured to latch the signals received by the respective buffers.

The second input unit 706 includes a buffer configured to receive the termination command CSTB and a latch circuit configured to latch the termination command received by the buffer.

The termination control unit 730 is activated by the termination command CSTB received by the second input unit 706. When the termination command CSTB is activated, the termination control unit 730 is enabled. When the termination command CSTB is deactivated, the termination control unit 730 is disabled. When the termination command CSTB is activated, the termination control unit 730 decodes the command signals CASB, RASB, and WEB transferred thereto, and controls the operations of the termination units 711 to 719. FIG. 7 illustrates an embodiment in which the termination control unit 730 decodes the column address strobe signal CASB, the row address strobe signal RASB, and the write enable signal WEB among the command signals CSB, CASB, RASB, and WEB to control the operations of the termination units 711 to 719. Depending on the design, the termination control unit 730 may decode a different type or number of command signals.

FIG. 7 illustrates that the termination control unit 730 decodes the command signals CASB, RASB, and WEB when the termination command CSTB is activated. However, a block CMD DEC&CTRL may help the termination control unit 730 to perform the decoding operation for the termination operation.

The turn-on/off of the termination units 711 to 719 and the change of the termination resistance values are controlled by the termination control unit 730, and the termination control unit 730 adjusts the resistance of the interface pads such as DQS pad and DQ pad for communication with the outside.

Among the blocks illustrated in FIG. 7, the configurations and operations of general blocks are apparent to those skilled in the area to which the present invention pertains. Therefore, the descriptions thereof are omitted herein.

FIG. 8 is a command decoding truth table in accordance with the embodiment of the present invention.

In FIG. 8, portions indicated by a dotted line represent an operation by the termination control unit 730. As seen in the portions indicated by the dotted line in FIG. 8, when the termination command CSTB is activated to low level, the functions for the termination operation are determined by combinations of command signals CASB, RASB, and WEB.

WRODT represents an ODT operation related to the write operation, that is, a termination operation related to a dynamic termination operation which changes the resistance values of the termination units in response to the write command. RDODT represents an ODT operation related to the read operation, that is, a termination operation which controls the disable of the termination units while data is outputted in response to the read command. OFFODT represents a termination operation for disabling the termination units. Furthermore, ONODT represents a termination operation for enabling the termination units.

FIG. 8 shows examples of the functions related to the termination operation and is not limiting. For example, some of the functions shown in FIG. 8 may be excluded, and other functions may be added.

Figure 9:
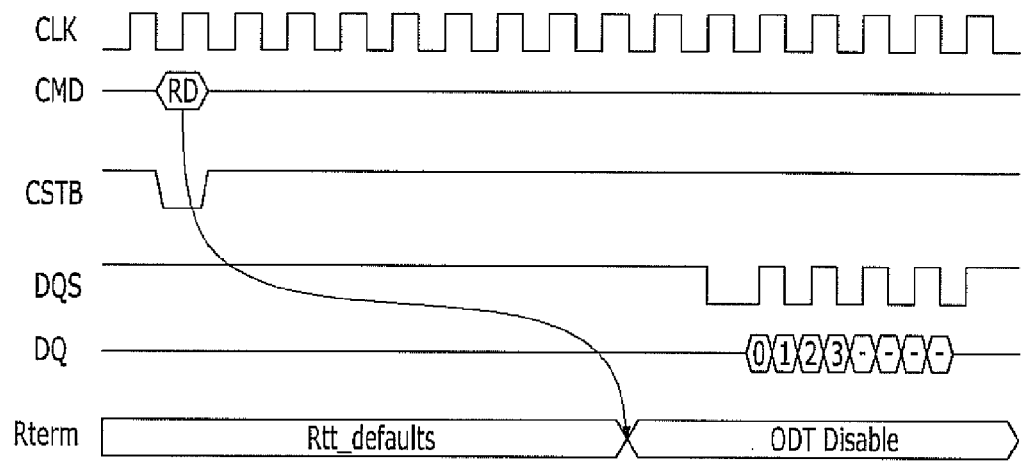
FIG. 9 is a timing diagram showing that termination units are controlled during a read operation of the memory device.

FIG. 9 is a timing diagram showing that the termination units 711 to 719 are controlled during the read operation.

In FIG. 9, a signal CMD indicates a result obtained by decoding the command signals CSB, CASB, RASB, and WEB, and a signal Rterm indicates the operation of the termination units 711 to 719.

First, the termination units 711 to 719 are enabled, and maintain a default termination resistance value Rtt_default. Then, the termination command CSTB is activated to low level, and simultaneously, a read command RD (CSB=L, RASB=H, CASB=L, and WEB=H) is applied. The termination control unit 730 decodes the command signals corresponding to the read command RD, and disables the termination units 711 to 719 during the period in which data is outputted in response to the read command RD.

Figure 10:
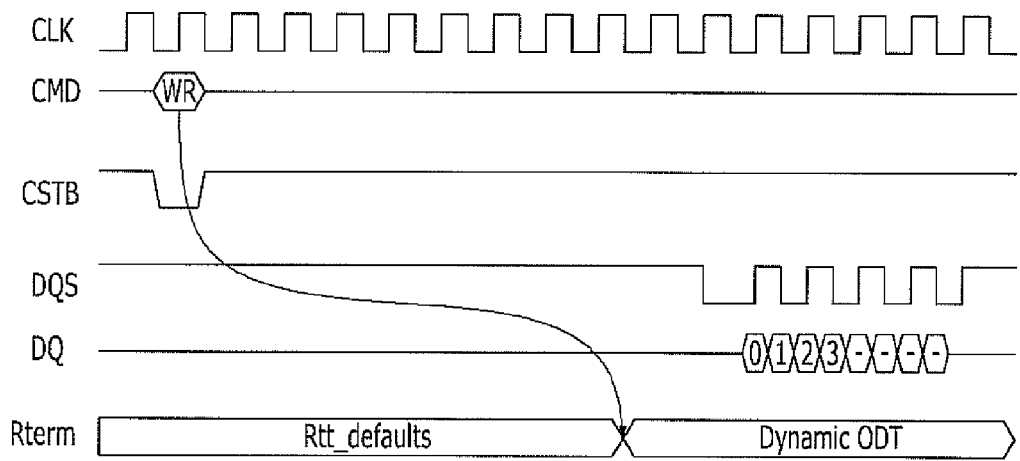
FIG. 10 is a timing diagram showing that the termination units are controlled during a write operation of the memory device.

FIG. 10 is a timing diagram showing that the termination units 711 to 719 are controlled during the write operation.

First, the termination units 711 to 719 are enabled to maintain the default termination resistance value Rtt_default. Then, the termination command CSTB is activated to low level, and simultaneously, a write command WR RASB=H, CASB=L, and WEB=L) is applied. The termination control unit 730 decodes the command signals corresponding to the write command WR, and changes the termination resistance value of the termination units 711 to 719 into a termination resistance value Dynamic ODT for the dynamic ODT operation during the period in which data is inputted in response to the write command WR.

Referring to FIGS. 9 and 10, it can be seen that the control of the turn-on/off of the termination units 711 to 719 and the control of the change of the termination resistance value are performed in the same manner.

Referring to FIGS. 6 to 10, a method for controlling the termination operation of the memory device in accordance with the embodiment of the present invention is described below.

The method for controlling the termination operation of the memory device in accordance with the embodiment of the present invention includes inputting commands CSB, RASB, CASB, and WEB for controlling the memory device; inputting a termination command CSTB for enabling the command CSB, RSAB, CASB, and WEB to be recognized as being related to a termination operation; decoding the command which is applied during a period in which the termination command CSTB is activated; and controlling the termination operation for interface nodes such as DQS and DQ pads depending on the decoding result.

The type and number of command signals CSB, RASB, CASB, and WEB which are decoded to control the termination operation may be changed depending on the design and rules.

In accordance with the embodiments of the present invention, the control of the turn-on/off of the termination circuits and the control of the change of the termination resistance value are performed in the same manner. Therefore, the burdens of the memory controller and the memory device related to the control of the termination circuits are reduced.

While the present invention has been described with respect to the specific embodiments, it will be apparent to those skilled in the art that various changes and modifications may be made without departing from the spirit and scope of the invention as defined in the following claims.

What is claimed is:

1. A semiconductor device comprising:
   a plurality of first input units configured to receive a command;
   a second input unit configured to receive a termination command;
   a termination control unit configured to be enabled by the termination command and decode the command received by the plurality of first input units to control a termination operation; and
   a termination unit configured to be controlled by the termination control unit and terminate an interface pad,
   wherein the termination control unit decodes the command received by the plurality of first input units during an activation period of the termination command to control the termination operation.

2. The semiconductor device of claim 1, wherein the termination command enables the semiconductor device to recognize the command received by the plurality of first input units as a command for controlling the termination operation.

3. The semiconductor device of claim 1, wherein the plurality of first input units receive at least two or more of a row address strobe signal, a column address strobe signal, a write enable signal, and a chip select signal.

4. The semiconductor device of claim 1, wherein the termination control unit controls turning on/off the termination unit and changing a termination resistance value of the termination unit.

5. The semiconductor device of claim 4, wherein the termination control unit disables the termination unit during a period in which data is outputted in response to a read command when the termination command is activated and the read command is applied after the termination unit is enabled to maintain a default termination resistance value.

6. The semiconductor device of claim 4, wherein the termination control unit changes the termination resistance value of the termination unit during a period in which data is inputted in response to a write command when the termination command is activated and the write command is applied after the termination unit is enabled to maintain a default termination resistance value.

7. A memory system comprising:
   a memory controller configured to apply a controlling command for controlling a memory device and a termination command for a termination operation to the memory device; and
   the memory device configured to decode the controlling command inputted during an activation period of the termination command and control the termination operation,
   wherein the memory device comprises:
   a plurality of first input units configured to receive the controlling command;
   a second input unit configured to receive the termination command;
   a termination control unit configured to be enabled by the termination command and decode the controlling command received by the plurality of first input units to control a termination operation; and
   a termination unit configured to be controlled by the termination control unit and terminate an interface pad;
   wherein the termination control unit decodes the controlling command received by the plurality of first input units during the activation period of the termination command.

8. The memory system of claim 7, wherein the plurality of first input units receive at least two or more of a row address strobe signal, a column address strobe signal, a write enable signal, and a chip select signal.

9. The memory system of claim 7, wherein the termination control unit disables the termination unit during a period in which data is outputted in response to a read command when the termination command is activated and the read command is applied after the termination unit is enabled to maintain a default termination resistance value.

10. The memory system of claim 7, wherein the termination control unit changes a termination resistance value of the termination unit during a period in which data is inputted in response to a write command when the termination command is activated and the write command is applied after the termination unit is enabled to maintain a default termination resistance value.

* * * * *